United States Patent
Alam et al.

(10) Patent No.: US 10,475,497 B2
(45) Date of Patent: *Nov. 12, 2019

(54) SELF-REFERENCED SENSE AMPLIFIER WITH PRECHARGE

(71) Applicant: EVERSPIN TECHNOLOGIES, INC., Chandler, AZ (US)

(72) Inventors: Syed M. Alam, Austin, TX (US); Chitra Subramanian, Mahopac, NY (US)

(73) Assignee: Everspin Technologies, Inc., Chandler, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/000,071

(22) Filed: Jun. 5, 2018

(65) Prior Publication Data

US 2018/0342276 A1    Nov. 29, 2018

Related U.S. Application Data

(63) Continuation of application No. 15/602,856, filed on May 23, 2017, now Pat. No. 10,020,041.

(51) Int. Cl.
*G11C 11/00* (2006.01)
*G11C 11/16* (2006.01)
*G11C 27/02* (2006.01)

(52) U.S. Cl.
CPC ...... *G11C 11/1673* (2013.01); *G11C 11/1675* (2013.01); *G11C 27/024* (2013.01)

(58) Field of Classification Search
CPC .................. G11C 11/1673; G11C 11/1675
USPC .......................................... 365/158
See application file for complete search history.

(56) References Cited

U.S. PATENT DOCUMENTS

| | | | |
|---|---|---|---|
| 8,923,041 B2 | 12/2014 | Andre et al. | |
| 9,183,912 B2 | 11/2015 | Gogl et al. | |
| 9,218,865 B2 * | 12/2015 | Andre ................. | G11C 11/1673 |
| 10,020,041 B1 | 7/2018 | Alam | |
| 2001/0024376 A1 | 9/2001 | Park et al. | |

* cited by examiner

*Primary Examiner* — Huan Hoang
(74) *Attorney, Agent, or Firm* — Bookoff McAndrews, PLLC

(57) ABSTRACT

Precharging circuits and techniques are presented for use with magnetic memory devices in order to speed up access to the memory cells for reading and writing. Including precharging in the sense amplifiers used to access the memory cells enables self-referenced read operations to be completed more quickly than is possible without precharging. Similarly, precharging can also be used in conjunction with write-back operations in order to allow the data state stored by magnetic tunnel junctions included in the memory cells to be changed more rapidly.

18 Claims, 8 Drawing Sheets

SELF-REFERENCED SENSE AMPLIFIER WITH PRECHARGE

CROSS-REFERENCE TO RELATED APPLICATION(S)

This application is a continuation application of U.S. Nonprovisional patent application Ser. No. 15/602,856, filed on May 23, 2017, the entirety of which is incorporated herein by reference.

TECHNICAL FIELD

The disclosure herein relates generally to magnetic memory devices, and, more particularly, to a sense amplifier with precharging used in such memory devices and corresponding methods.

BACKGROUND

Spin-torque magnetic memory devices store information by controlling the resistance across a magnetic tunnel junction (MTJ) such that a read current through the magnetic tunnel junction results in a voltage drop having a magnitude that is based on the state of the magnetoresistive stack. The resistance in each magnetic tunnel junction can be varied based on the relative magnetic states of the magnetoresistive layers within the magnetoresistive stack. In such memory devices, there is typically a portion of magnetoresistive stack that has a fixed magnetic state and another portion that has a free magnetic state. The free portion is controlled to be in one of two possible states relative to the portion having the fixed magnetic state. Because the resistance through the magnetic tunnel junction changes based on the magnetic orientation of the free portion relative to the fixed portion, information can be stored by setting the orientation of the free portion.

Each memory cell often includes a magnetic tunnel junction coupled in series with a corresponding selection transistor, where the selection transistor allows each memory cell to be individually selected for access. In some architectures, each memory cell is coupled between two common lines, which are often referred to as a bit line and a source line. A memory array typically includes many bit lines and source lines that allow selective access to subsets of the memory cells within the array. Word lines are coupled to the gates of the selection transistors, thereby controlling current flow through the series circuit of each memory cell based on the voltages applied to the ends of the magnetic memory cell by, for example, the bit lines and source lines.

Writing to magnetic memory cells can be accomplished by sending a spin-polarized write current through the memory cell where the angular momentum carried by the spin-polarized current can change the magnetic state of the free portion of the magnetic tunnel junction. One of ordinary skill in the art understands that such a current can either be directly driven through the memory cell or can be the result of applying one or more voltages, where the applied voltages result in the desired current. Depending on the direction of the current through the memory cell, the resulting magnetization of the free portion will either be parallel or antiparallel to the fixed portion. If the parallel orientation represents a logic "0", the antiparallel orientation represents a logic "1", or vice versa. Thus, the direction of write current flow through the memory cell determines whether the memory cell is written to a first state or a second state.

The information stored in the memory cells can be retrieved by sensing the orientation of the free portion. A magnetic random access memory ("MRAM") may include thousands or millions of memory cells, and the distribution of memory cell resistances across an MRAM may be significant. As such, it is desirable to provide access circuitry for MRAMs that accurately determines the information stored in the memory cells in a manner that supports high-speed operation.

DETAILED DESCRIPTION

The following detailed description is merely illustrative in nature and is not intended to limit the embodiments of the subject matter or the application and uses of such embodiments. Any implementation described herein as exemplary is not necessarily to be construed as preferred or advantageous over other implementations.

For simplicity and clarity of illustration, the figures depict the general structure and/or manner of construction of the various embodiments. Descriptions and details of well-known features and techniques may be omitted to avoid unnecessarily obscuring other features. Elements in the figures are not necessarily drawn to scale: the dimensions of some features may be exaggerated relative to other elements to assist improve understanding of the example embodiments.

The terms "comprise," "include," "have" and any variations thereof are used synonymously to denote non-exclusive inclusion. The term "exemplary" is used in the sense of "example," rather than "ideal."

In the interest of conciseness, conventional techniques, structures, and principles known by those skilled in the art may not be described herein, including, for example, standard magnetic random access memory (MRAM) manufacturing techniques, generation of bias voltages, fundamental principles of magnetism, and basic operational principles of memory devices. Conventional techniques related to reading and writing memory, and other functional aspects of certain systems and subsystems (and the individual operating components thereof) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter.

During the course of this description, like numbers may be used to identify like elements according to the different figures that illustrate the various exemplary embodiments.

Figure 1:
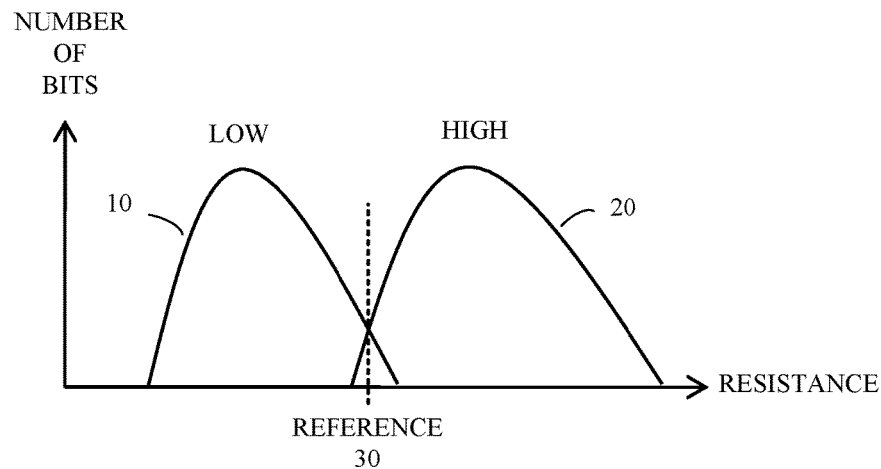
FIG. 1 is a graph showing resistance distribution of memory cells included in an array of magnetic memory cells.

Magnetic memory devices and other memory devices often include an array of memory cells divided into a plurality of banks or subarrays. Variations in the structures of the magnetic tunnel junctions and processing operations involved in manufacturing can result in a wide distribution of magnetic tunnel junction resistances across an array of memory cells. FIG. 1 illustrates a graph showing the distribution of resistances for memory cells (bits) in a memory array. The curve 10 represents the distribution of resistances for memory cells having a "low" resistance corresponding to the free portion in the magnetoresistive stack for the magnetic tunnel junction being in a parallel orientation with respect to the fixed portion, and the curve 20 represents the distribution of resistances for memory cells having a "high" resistance corresponding to the free portion being in an anti-parallel orientation with respect to the fixed portion. As is shown, the resistance distribution for each of the curves 10 and 20 is significant and there is some overlap between the two curves. As such, when trying to ascertain the data state stored in each memory cell, comparing the sensed resistance through the cell with a reference 30 does not always provide an accurate determination of the data state stored in the memory cell. Moreover, even in a memory array in which the curves 10 and 20 are distinct and do not overlap, variations in the circuitry used for determining the stored data states based on a reference can result in errors if sufficient separation between the curves is not provided. As such, sensing schemes that use a reference for comparison with the sensed resistance though a memory cell may not be adequate in some memories.

In order to accurately ascertain the data state stored in the magnetic tunnel junction of a memory cell, a self-referenced read operation can be performed. In such a self-referenced read operation, the resistance through the memory cell is sensed during a first sensing operation, where a voltage indicative of that resistance is generated and stored for later use in a comparison operation. This phase of the self-referenced read operation may be referred to as the sampling phase.

Following the first sensing operation of the sampling phase, a first write current is applied through the magnetic tunnel junction in order to force the magnetic tunnel junction into a known first state. For example, a down-current write, which, in some embodiments, corresponds to a current that flows through the magnetic tunnel junction of the memory cell before flowing through the corresponding selection transistor, can be used to force the magnetic state of the magnetic tunnel junction into the low resistance state ("low state") in which the free portion is parallel to the fixed portion.

In a self-referenced read operation, using a down-current write to put the magnetic tunnel junction in a known state may be preferable to the opposite up-current write as the up-current write often requires a higher word line voltage applied to the gate of the selection transistor than the word line voltage for a down-current write. The higher word line voltage for the up-current write is a result of the voltage drop across the magnetic tunnel junction elevating the source voltage on the selection transistor such that a higher gate voltage on the selection transistor is needed to have sufficient gate-to-source voltage on the transistor to support the current flow needed to change the state of the magnetic tunnel junction. In contrast, the word line voltage applied to the gate of the selection transistor for the down-current write can be the same as the word line voltage used for sensing operations (reading). As such, during a self-referenced read the same word line voltage can be applied throughout the self-referenced read when the down-current write is used to place the magnetic tunnel junction in the known state. This is preferable to having the change the word line voltage when switching between writing and sensing operations.

Following application of the first write current to put the magnetic tunnel junction in a known first state, a second sensing operation is used to determine the resistance of the memory cell in the known first state. The second sensing operation may be referred to as an evaluation phase as a voltage determined based on the resistance of the memory cell detected during the second sensing operation is compared with the stored voltage indicative of the resistance sampled during the first sensing phase. Based on the comparison, it can be determined whether or not the resistance of the magnetic tunnel junction changed as a result of the first write current.

If the resistance through the magnetic tunnel junction is unchanged by the first write current, then the initial magnetic state of the magnetic tunnel junction is the low state (i.e. the same state that results from a down-current write). On the other hand, if the resistance through the magnetic tunnel junction detected in the second sensing operation is different from the resistance detected during the first sensing operation, then the first write current resulted in a change in the state of the magnetic tunnel junction from an initial high resistance state ("high state") to the low state.

In order to simplify the comparison operation performed during the evaluation phase, an added offset current through the magnetic tunnel junction during either the first or second sensing operation can be used to shift the voltage drop across the magnetic tunnel junction by a certain amount, thereby intentional skewing the second sensing operation to enable an easier comparison. For example, if the first sensing operation includes applying a read voltage across the magnetic tunnel junction that results in a first amount of current through the magnetic tunnel junction, the resistance of the magnetic tunnel junction can be determined based on the amount of current that flows as a result of the read voltage applied. Notably, the read voltage should be low enough such that the magnetic state of the memory cell is not disturbed. If the same read voltage is applied across the magnetic tunnel junction in the evaluation phase, it may be hard to determine whether the resulting current, and thus the resistance through the magnetic tunnel junction after the write current has been applied, is exactly the same as the current induced by the first application of the read voltage during the sampling phase. By adding an additional amount of offset current through the magnetic tunnel junction in the evaluation phase, the total amount of current through the magnetic tunnel junction in the evaluation phase is equal to the current resulting from the application of the read voltage across magnetic tunnel junction plus the offset current also being applied. When the total current through the magnetic tunnel junction is converted to an evaluation voltage for comparison purposes, the offset current will contribute to that evaluation voltage, thereby ensuring there is a differential or offset between the sample voltage stored during the first sensing phase and the evaluation voltage generated during the second sensing operation of the evaluation phase.

Figure 2:
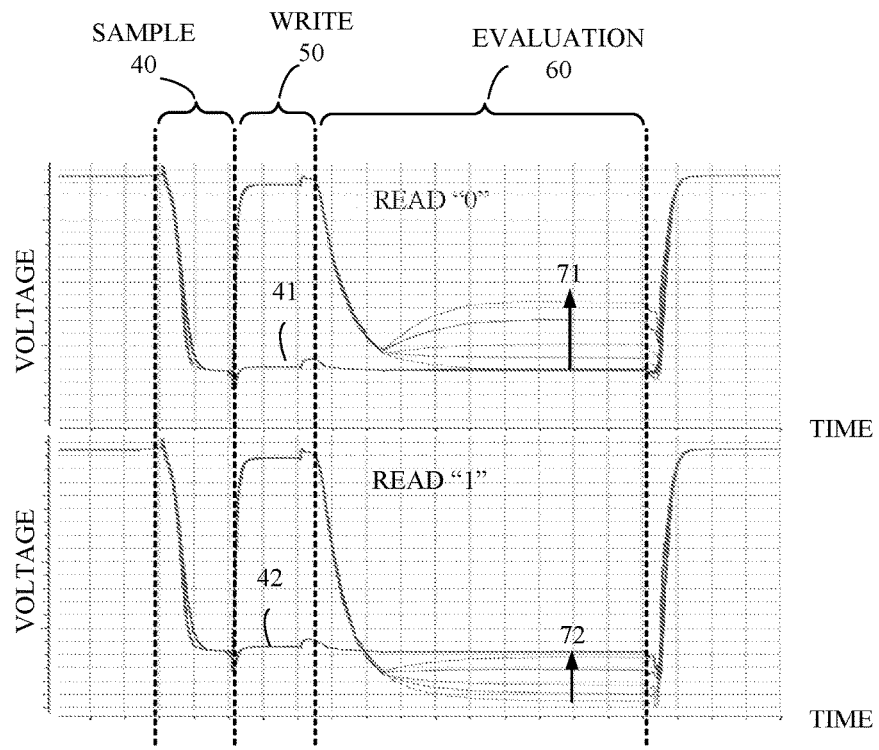
FIG. 2 is a graph showing voltages across a magnetic tunnel junction at sense amplifier critical nodes during an activate operation in accordance with exemplary embodiments.

FIG. 2 helps illustrate the self-referenced read concept and associated timing. FIG. 2 includes two graphs corresponding to self-referenced read operations. The top half of FIG. 2 shows a first self-referenced read operation determines that the initial state of the magnetic tunnel junction was the low state. The bottom half of FIG. 2 shows a second self-referenced read that determines that the initial state of the magnetic tunnel junction was the high state. Referring to the top half of FIG. 2, the sample operation 40 determines a voltage 41 corresponding to the initial resistance through the magnetic tunnel junction during a first sensing operation. As discussed in more detail below, the voltage 41 is a voltage generated based on an amount of current flow through the magnetic tunnel junction as a result of a read voltage being applied across the magnetic tunnel junction. Following the sample operation 40, a write operation 50 forces the magnetic tunnel junction into a known first state. After completion of the write operation 50, an evaluation operation 60 occurs. During the evaluation phase, a second sensing operation is performed that includes the application of an offset current.

As shown in the top half of FIG. 2, differing amounts of offset current provide for different resulting voltages 71 sensed during the evaluation phase 60. In other words, the thinner lines corresponding to multiple voltage levels that fan out from the thicker line correspond to different offset currents applied. While the voltages corresponding to multiple different offset currents are shown in FIG. 2, in operation, a single preferred amount of offset current is applied, where the shift in voltage achieved by the preferred amount of offset current ensures accurate comparisons for both the read "0" and read "1" scenarios. Such a preferred amount of offset current can be determined based on an initial "sweeping" of, or sequential application of, different offset currents in order to determine the preferred amount of offset current that produces the best results. Notably, if no offset current were applied, the resulting voltage in the evaluation phase 60 in the top half of FIG. 2 would be essentially the same as or very close to the voltage level 41 determined during the initial sample phase 40.

Referring to the bottom half of FIG. 2, the sample voltage 42 generated during the sample operation 40 in the case of a read "1" scenario is greater than the sample voltage 41 determined during the initial sample operation 40 for the read "0" scenario. Following the sample operation 40 for the read "1" scenario, the first write current applied during write operation 50 changes the state of the magnetic tunnel junction such that the voltage 72 determined during the evaluation operation 60 is less than the initial voltage 42 detected during the sample phase 40. Note that FIG. 2 also shows multiple different voltages corresponding to differing offset currents.

Thus, as a result of the offset current, in the read "0" scenario shown in the top half of FIG. 2, the voltage determined during the evaluation phase 60 is greater than the voltage 41 corresponding to the initial state of the magnetic tunnel junction. In the bottom half of FIG. 2, if no offset current were applied, there would be a relatively large differential between the voltage 42 determined during the sample phase 40, which corresponds to the magnetic tunnel junction in its initial state, and the voltage determined during the evaluation phase 60, which corresponds to the magnetic tunnel junction in a different state. However, the offset current reduces that differential to some degree. By choosing the correct amount of offset current to be applied, the differential established based on the offset current in the top half of FIG. 2 can be balanced with the differential removed based on the offset current in the bottom half of FIG. 2. With the proper amount of offset current applied, the determination of the initial state of the magnetic tunnel junction can be achieved with a simple less-than or greater-than comparison between the sample voltage and the evaluation voltage.

The self-referenced read operation is not dependent upon any fixed reference and instead relies on a comparison based on an initial state of the magnetic tunnel junction and a known state of the same magnetic tunnel junction. As such, variations in individual magnetic tunnel junction resistance characteristics across an array of memory cells do not impact the ability to accurately ascertain the data state stored in those magnetic tunnel junctions.

The self-referenced read operation discussed above can be performed as a part of an activate operation, where the activate operation corresponds to reading the stored states of a set of memory cells, where the data corresponding to those stored states can then be loaded into temporary data storage (e.g. a cache) for access. Loading such a set of data into temporary data storage is commonly referred to as opening a page, where the page corresponds to the set of memory cells whose data values are loaded into the temporary data storage. Protocols such as the synchronous DRAM (SDRAM) and multiple renditions double data rate SDRAM (DDR SDRAM) support activate commands that are used to open a page, and the present disclosure includes embodiments of MRAM that support those protocols. Once the page has been opened, read and write commands to the page can be performed, where those commands access the data stored in the temporary data storage. Upon completion of the read and write accesses to the open page, the page is closed. Closing the page results in the data states in the temporary data storage for the page being written back to the actual memory cells in the memory array. Because the activate operation has left all of the memory cells in the page in the known first state because of the down-current write between the two sensing operations, only those memory cells that are to store the second state need to be written to during the write-back operation corresponding to closing the page. Such a write-back operation, which uses an up-current write, can be performed in response to a precharge command as that command is understood in the context of the DDR SDRAM protocol, or in response to other commands or internal signals indicating such an operation to be performed.

As shown in FIG. 2 the movement between the different phases of the self-referenced read operation require large voltage swings across the magnetic tunnel junction and on the signal lines used to drive the voltages on the ends of the magnetic tunnel junction. As the architecture and makeup of magnetic tunnel junctions continues to evolve, magnetic tunnel junctions having higher resistance values are becoming more prominent, thereby resulting in slower transition times between the different phases of the self-referenced read operation as the higher resistance-capacitance (RC) values slow down signal transition times. For example, perpendicular spin torque magnetic tunnel junction memory cells have a higher resistance than previous generation in-plane magnetic tunnel junctions. As such, the time needed to complete the phases of the self-referenced read operation can increase when the resistance of the magnetic tunnel junction increases. As described herein, including certain precharge circuitry within the sense amplifier circuitry used for performing the self-referenced read and write back operations helps alleviate some of the potential drawbacks in terms of timing associated with higher resistance magnetic tunnel junctions.

Figure 3:
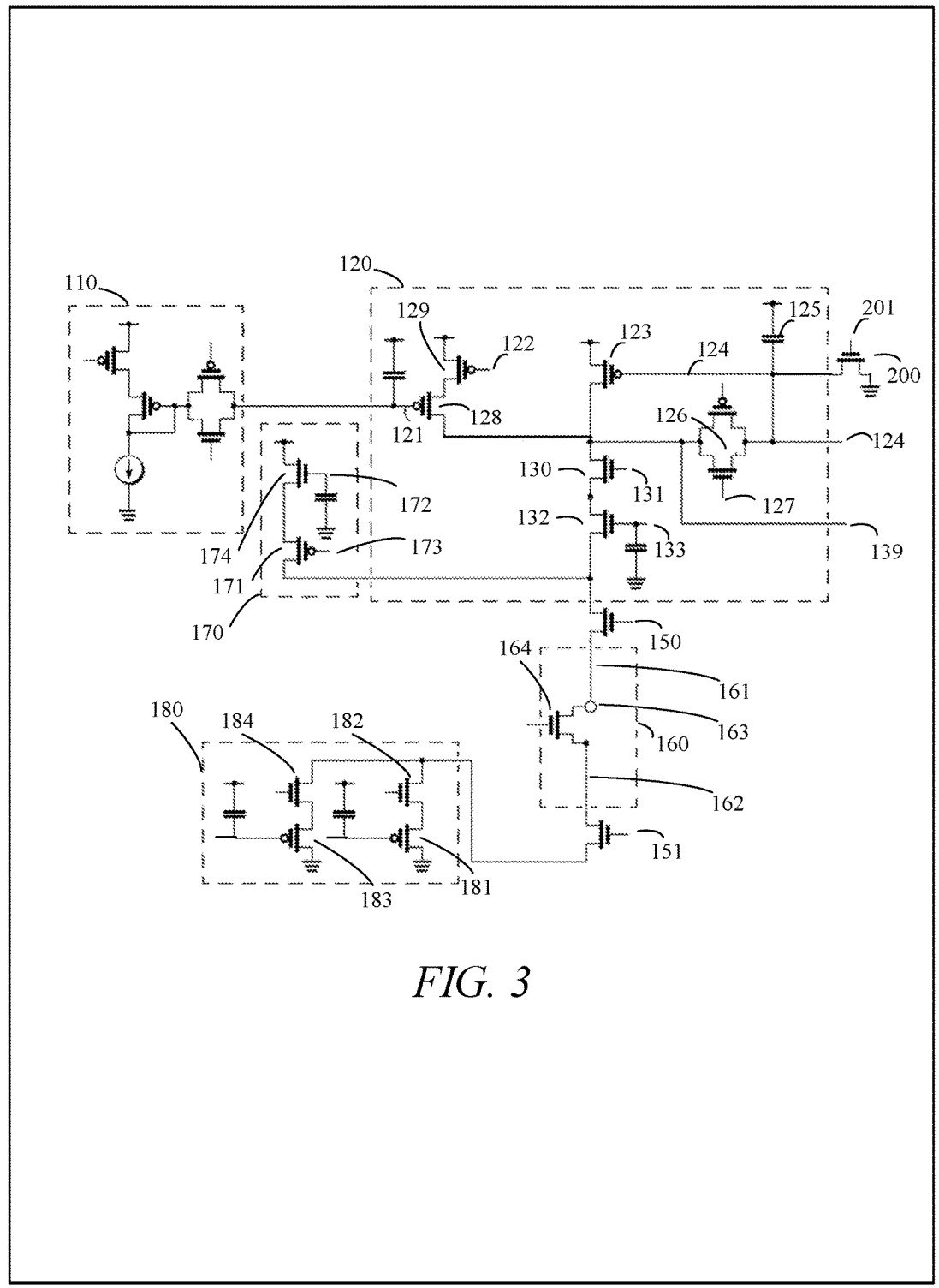
FIGS. 3-5 are schematic diagrams showing sense amplifier circuitry that includes precharge circuitry in accordance with exemplary embodiments.

FIG. 3 illustrates a schematic diagram of sense amplifier circuitry that can be used in conjunction with magnetic memory in order to perform operations such as the self-referenced read discussed above. FIG. 3 includes a memory cell 160 that includes a magnetic tunnel junction 163 coupled in series with a selection transistor 164. A first end of the memory cell 160 is coupled to a first common line 161, and a second end of the memory cell 160 is coupled to a second common line 162. In some embodiments, common line 161 is a bit line, whereas common line 162 is a source line. Access to an individual memory cell is accomplished by driving the word line coupled to the gate of the selection transistor 164 as well as using column select devices controlled using inputs 150 and 151. For example, when the input signals 150 and 151 are both high and the word line coupled to the gate of selection transistor 164 is driven to a sufficient voltage, current can flow through the magnetic tunnel junction 163.

Preamplifier circuitry 120 includes circuitry used to apply the read voltage across the magnetic tunnel junction 163. Such circuitry includes NMOS-follower circuitry that includes NMOS-follower transistor 132 and switch transistor 130. The gate of NMOS-follower transistor 132 is coupled to a read bias voltage 133 that is set to a voltage level corresponding to a desired read voltage to be applied on the bit line 161. The generation of such bias voltages used to control such NMOS-follower transistors is discussed in detail in U.S. Pat. No. 9,183,912. When the gate 131 of switch transistor 130 is pulled high, current is able to flow through NMOS-follower transistor 132 such that the appropriate read voltage can be applied across the magnetic tunnel junction 163. While many of the embodiments described herein include NMOS-follower and PMOS-follower circuits used to drive voltages on the ends of the memory cells, in other embodiments, other drivers can be used in conjunction with the precharge circuits and techniques described herein.

Transistor 123, which functions as a PMOS diode during the sample phase, converts current flowing through transistor 123 to a voltage on node 124, which, during the sample operation corresponding to the first sensing phase, can be stored as the sample voltage on capacitor 125. This is accomplished by opening transmission gate 126 during the sample phase, while maintaining transmission gate 126 closed during the later write and evaluation phases included in the self-referenced read. Thus, the initial sample voltage determined during the first sensing operation is present on signal line 124.

Sense amplifier circuitry 120 also includes circuitry to support the offset current applied during the evaluation operation. Such circuitry includes transistors 128 and 129 that are able to generate the offset current based on the input bias signal 121 provided to transistor 128 as well as the enable signal 122 provided to transistor 129, where enable signal 122 is driven low during the evaluation phase of the self-referenced read operation in order to allow the offset current to flow. The input bias signal 121 provided to transistor 128 is sourced from a global sense amp offset circuit 110 that generates the bias signal 121 to establish a known level of offset current.

FIG. 3 also shows a down current NMOS-follower circuit 170 used to generate the appropriate voltage across the magnetic tunnel junction 163 to result in the desired level of down current needed to set the magnetic tunnel junction 163 to the known first state, which happens between the two sensing operations associated with the self-referenced read operation. The down current NMOS-follower circuit 170 includes NMOS-follower transistor 174 that receives a bias voltage 172 used to establish the correct down-current write voltage to be applied. Switch transistor 171 is enabled using control signal 173 such that the appropriate voltage for the down-current write is only applied during the write phase of the self-referenced read operation.

FIG. 3 also illustrates PMOS-follower circuitry 180 coupled to the second end of the memory cell 160, where the PMOS-follower circuitry 180 is used to establish the voltage on the second end of the memory cell during sensing and down-current write operations. While FIG. 3 shows PMOS follower circuitry 180, in other embodiments, a simple pulldown switch transistor coupled to ground can be used to provide a low voltage on the second end of the memory cell 160. In the embodiment shown in FIG. 3, the PMOS follower circuitry 180 includes a first PMOS follower circuit that includes PMOS follower transistor 183 and switch transistor 184. This first PMOS follower circuitry corresponds to the follower circuitry used for a down-current write operation such that the appropriate voltage is established on the second end of the memory cell 160 when the NMOS-follower circuitry 170 is applying the voltage on the first end of the memory cell. Thus, during a down-current write operation, the gate of transistor 184 is pulled high and a bias voltage applied to the gate of transistor 183 is used to establish the desired voltage on the second end of the memory cell. Similarly, transistors 181 and 182 can be used to generate a different desired voltage on the second end of the memory cell 160 during sensing operations such as those that occur before and after the down-current write during a self-referenced read operation.

Note that while the embodiment of FIG. 3 shows two different sets of PMOS-follower circuitry used to provide different voltages on the second end of the memory cell 160 during different phases of the self-referenced read operation, in other embodiments only one PMOS-follower circuit is included. As noted above, in other embodiments, a pass gate, pull-down NMOS transistor, or other circuit can be used to establish the voltage on the second end of the memory cell. Having two sets of PMOS-follower circuitry allows for very precise regulation of the voltage across the memory cell that may be more difficult with other options. Notably the size of the transistors within the respective PMOS-follower circuits may be different such that higher current levels can be supported by the circuit active during the down-current write.

In the first sensing operation of an activate operation, the NMOS-follower circuitry that includes transistors 130 and 132 is used to apply a first voltage to the first end of the memory cell 160. This is accomplished by applying a high voltage on the gate 150 of the column select device that couples the NMOS-follower circuitry to the bit line 161 and applying a high voltage on the gate 131 of the switch transistor 130. Similarly, the gate 151 of the other column select transistor is pulled high to allow the PMOS-follower circuitry that includes transistors 181 and 182 to pull the source line 162 to a low voltage, thereby applying a first voltage across the memory cell 160 such that the read voltage is applied across the magnetic tunnel junction 163. The current resulting from the application of the read voltage flows through transistor 123, which converts the current flowing through it into a sample voltage that is stored on the capacitor 125.

After the first sensing operation, the NMOS-follower and PMOS-follower circuitry used to perform the first sensing are gated off from the memory cell 160 using the switch transistors 130 and 182. The NMOS-follower circuitry 170 used for the down-current write is then enabled along with the corresponding PMOS-follower circuitry that includes transistors 183 and 184. As a result, a high voltage is applied across the magnetic tunnel junction that results in the down current needed to force the magnetic tunnel junction into the low state.

After the down-current write is complete, the NMOS-follower circuitry 170 and PMOS-follower circuitry used in the down-current write are gated off from the memory cell 160 and then the NMOS-follower and PMOS-follower circuitry used for the first sensing operation are used to once again apply the read voltage across the memory cell 160. While the read voltage is being re-applied, the offset current is added by asserting a low voltage on the gate 122 of transistor 129. Because the sample voltage is on the node 124 and stored on capacitor 125, the current through transistor 123 will be the same during the second sensing operation as it was during the first sensing operation. The addition of the offset current changes the voltage drop across the memory cell such that the voltage on signal line 139, which corresponds to the evaluation voltage, can be easily compared with the original sample voltage on signal line 124. Thus, a determination as to whether the down-current write operation changed the state of the magnetic tunnel junction 163 can be made in order to determine the initial data state of the magnetic tunnel junction 163.

As noted above with reference to FIG. 2, as the resistance of the magnetic tunnel junction increases, the time required to cause the signal transitions on the signal lines coupled to the magnetic tunnel junction increases. For example, the increased magnetic tunnel junction resistance increases the settling time for the bit line coupled to the first end of the memory cell during the sample phase (e.g. the time it takes to determine the sample voltage 41 in FIG. 2). Similarly, because the bitline is raised to a high voltage during a down-current write, it can take a long time for the NMOS-follower circuitry that includes transistors 130 and 132 to reduce the bitline voltage during the evaluation phase. Embodiments presented herein provide for precharge schemes that speed up the sample and evaluation phases.

FIG. 3 includes an additional precharge transistor 200 coupled between the gate of PMOS transistor 123 and a low voltage source. In the embodiment illustrated, the low voltage source is ground, but other low voltage sources can be used in other embodiments. During standby, when an activate or other access operation is not underway, the gate 201 of transistor is pulled high in order to couple the node 124 to the low voltage source. Consequently, the low voltage applied to the gate of transistor 123 pulls the signal line 139 corresponding to the evaluation voltage high during such standby periods. Once a self-referenced read operation (or other operation with which the transistor 200 would impact) is commenced, the gate 201 of transistor 200 is deasserted low and the node 124 is no longer held low.

Thus, at the start of the first sensing operation corresponding to a self-referenced read, the gate-to-source voltage for the transistor 123 is high, thereby allowing it to immediately provide current associated with applying the read voltage across the magnetic tunnel junction. Also, because the node corresponding to the evaluation voltage 139 is precharged high, once the NMOS-follower circuit that includes transistors 130 and 132 begins to drive the read voltage, charge sharing between the evaluation node 139 and the bitline 161 occurs, thereby enabling the bitline 161 to be brought up to the read voltage more rapidly than if no such charge sharing occurred. Thus, the precharge transistor 200 added to the sense amplifier circuitry allows for the first sensing operation to be sped up.

Note that the control signals applied to the various circuits shown in the schematic diagrams can be sourced by control circuitry, which can be discrete components, a processor, state machine, or the like. Such control circuity is configured to apply the appropriate control signals and bias signals to the circuits at the appropriate times in order to achieve the operations described herein.

Figure 4:
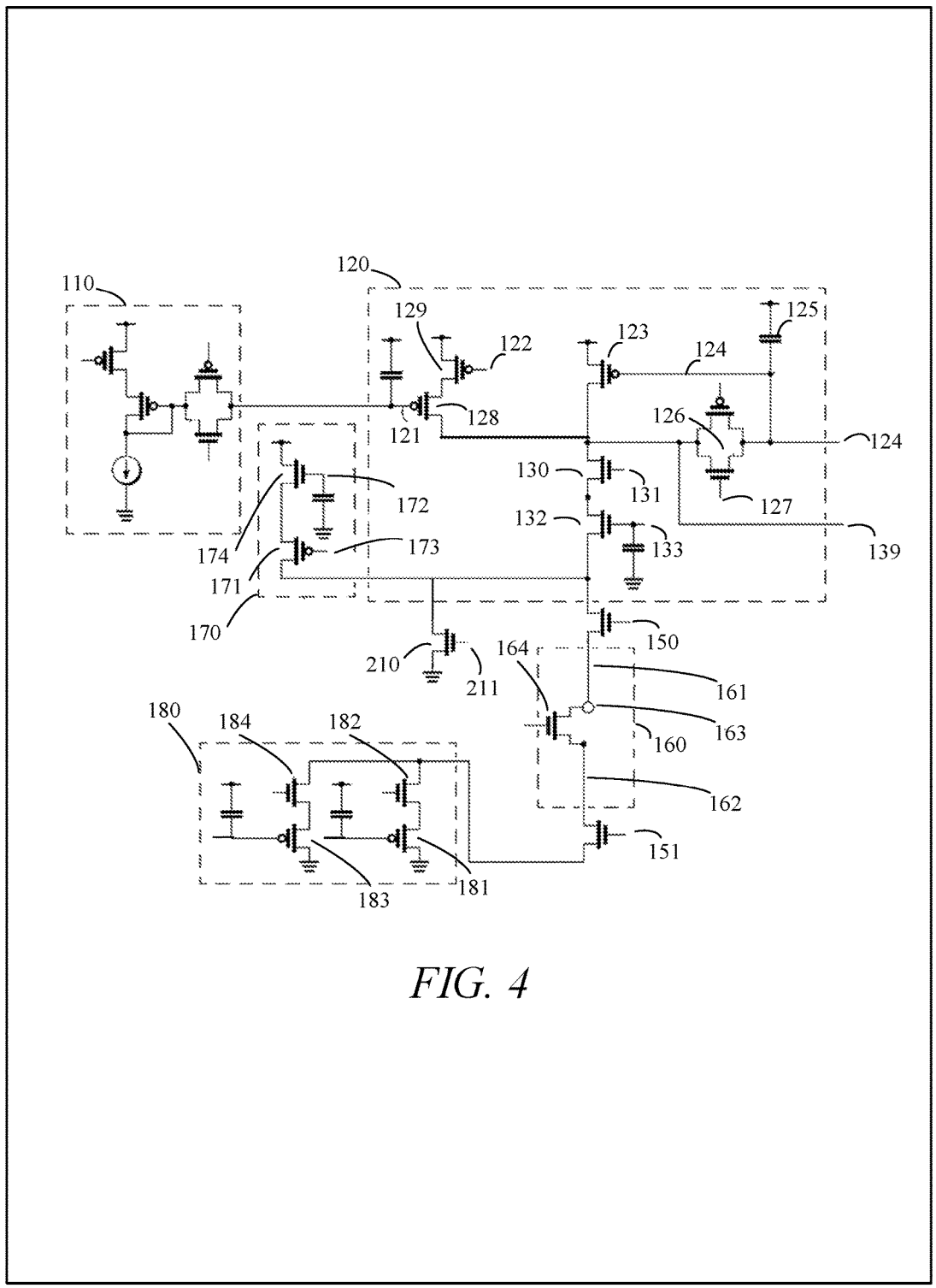

FIG. 4 illustrates another embodiment that enables the evaluation phase to be sped up. In the embodiment of FIG. 4, precharge transistor 210 is added, where precharge transistor 210 is able to pull the bit line down after the down current write and prior to the sensing operation associated with the evaluation phase. When the down-current write operation is performed during the self-referenced read operation, the high write current results from a high voltage at the end of the memory cell corresponding to the bit line. The voltage on the bit line during the write is typically much higher than that used to provide the read voltage across the magnetic tunnel junction during the sensing operation of the evaluation phase. Because of this, the NMOS-follower circuitry that includes transistors 130 and 132 that is used to apply the read voltage may take a long time to establish the read voltage across the magnetic tunnel junction. Transistor 132 does not achieve a high enough gate-to-source voltage or gate over-drive when voltage on the bitline is high, and consequently operates in below- or sub-threshold region for some time until voltage on the bitline gets to a low voltage. This delay can be long when magnetic tunnel junction resistance is large, thus increasing the sensing time. By applying a pulse to the gate 211 of transistor 210, the voltage on the bitline can be quickly reduced prior to the start of the second sensing operation, thereby enabling the NMOS-follower circuitry to more rapidly establish the read voltage across the magnetic tunnel junction. This is due in part to the NMOS-follower circuitry will have sufficient gate-to-source voltage to start regulation of the read voltage to be applied. Note that while FIG. 4 shows the transistor 210 coupled to ground, a different low voltage source can be used to allow the bit line to be pulled to a lower voltage. For example, the voltage on the source of transistor 210 could be a voltage other than ground that helps to quickly establish the need voltage on the bitline 161 for the second sensing operation.

Thus FIG. 3 shows the inclusion of a first precharge transistor 200 that helps to decrease the time needed for the first sensing operation, whereas FIG. 4 shows the inclusion of a second precharge transistor that helps to decrease the time needed for the second sensing operation. While the two precharge transistors can be used independently and are not both required in all embodiments, FIG. 5 shows an embodiment in which both precharge transistors are included such that both of the sensing operations in the self-reference read can be performed more quickly than without the precharge transistors.

Figure 5:
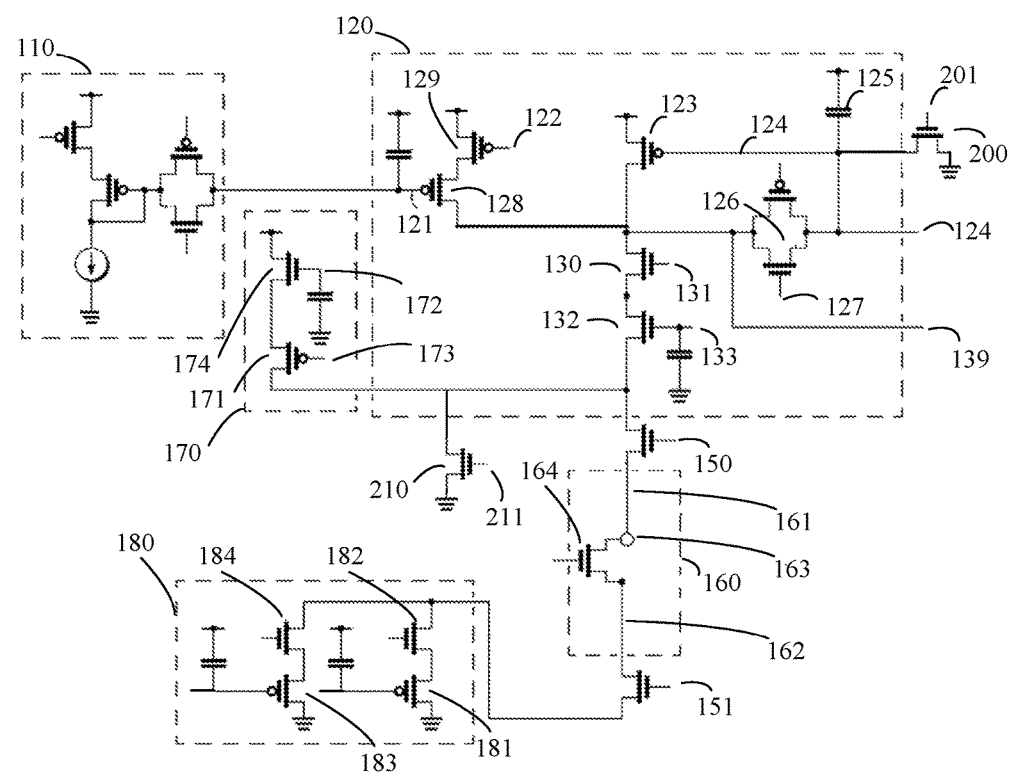
Figure 6:
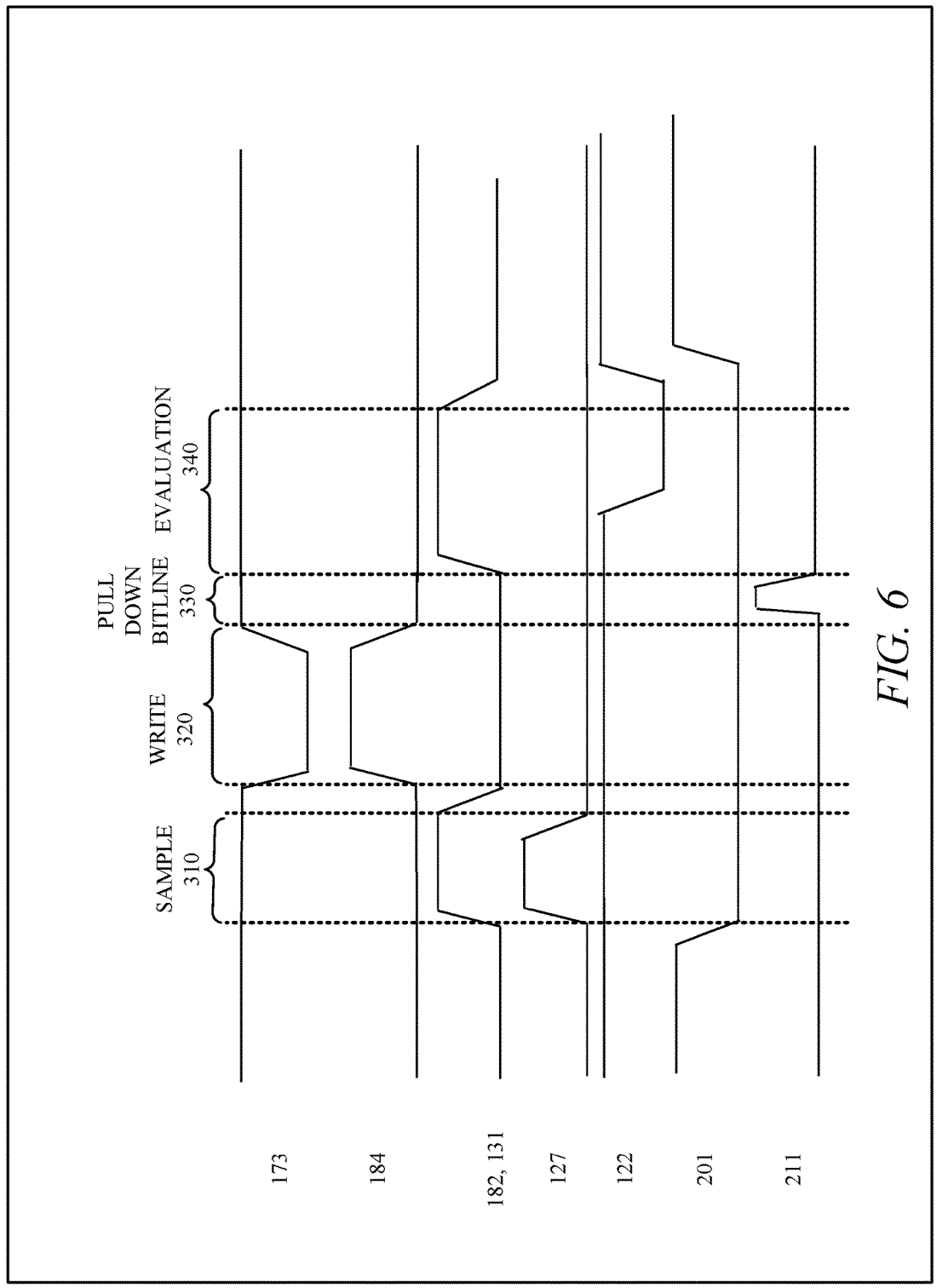
FIG. 6 is a timing diagram corresponding to operation of sense amplifier circuitry that includes precharge circuitry in accordance with an exemplary embodiment.

FIG. 6 illustrates a timing diagram showing certain signal transitions associated with performing a self-referenced read operation in the context of the circuitry illustrated in FIG. 5. In the initial state before the self-referenced read operation begins, which may be referred to as a "precharge phase," the gate 201 of transistor 200 is asserted high, thereby causing precharge transistor 200 to hold the node 124 in a low state. Node 124 in the low state causes the transistor 123 to pull the evaluation node 139 high.

At the beginning of the sample phase 310, the gate 201 of the precharge transistor 200 is de-asserted such that the node 124 is no longer held low. Signals 182 and 131, which correspond to the switch transistors included in the NMOS-follower and PMOS-follower circuitry used to drive the read voltage, are asserted high, thereby causing the read voltage to be asserted across the magnetic tunnel junction. Signal 127, which corresponds to opening the pass gate 126, is driven high to enable the sample voltage detected during the first sensing phase to be stored on transistor 125.

During the write phase 320 of the self-referenced read operation, signal 173 is used to enable the NMOS-follower circuitry 170 to drive the down-current write voltage onto the bit line 161. Similarly, signal 184 is asserted high in order to turn on the PMOS follower circuitry used to drive the source line 162 to the appropriate voltage during the down-current write.

After the write phase 320 is complete, a short pulse is applied on the gate 211 of the precharge transistor 210 during the pull down bit line phase 330. The pulse results in the voltage on the bit line, which was driven to a very high level during the write phase 320, being pulled down rapidly in preparation for the evaluation phase 340.

During the evaluation phase 340, signals 182 and 131 are once again asserted in order to reapply the read voltage across the magnetic tunnel junction via the corresponding NMOS-follower and PMOS-follower circuitry used to drive the read voltage. In addition, signal 122 is asserted low in order to enable the offset current to be applied during the evaluation phase, thereby providing a guaranteed differential between the voltage detected at the evaluation node 139 and that stored in the capacitor 125 at node 124. Note that in the embodiment illustrated, the evaluation phase 340 may extend the assertion of certain signals longer than those in the sample phase in order to allow for additional settling time. Upon completion of the self-referenced read, the gate 201 of transistor 200 is returned to the high state, thereby pulling node 124 low once again such that the evaluation node is precharged during the steady state.

Figure 7:
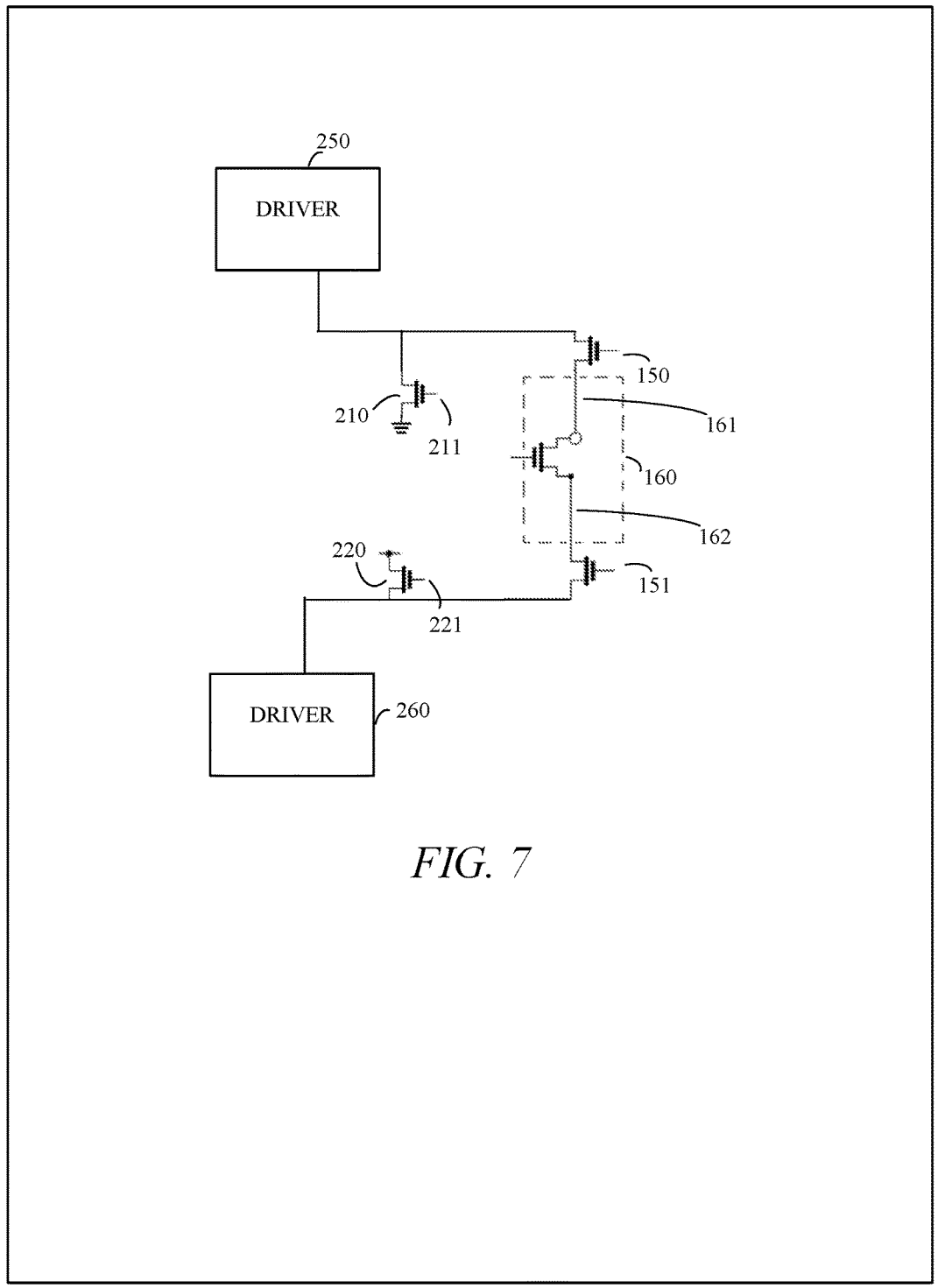
FIG. 7 is a schematic diagram showing sense amplifier circuitry that includes precharge circuitry in accordance with another exemplary embodiment.

FIG. 7 shows a schematic diagram that includes another precharge transistor 220 that is coupled between the source line and a high voltage. The embodiment of FIG. 7 focuses on a write-back operation used during precharge or similar operations, and, as such, much of the sense amplifier circuitry of FIG. 5 is not shown in order to simplify the diagram even though the circuitry can all be used together in an MRAM. As noted above, during a write-back operation, those memory cells that are to store the second state (e.g. the high state when the low state is stored in every memory cell in the page during the self-referenced read) are forced to the second state using an up-current write. In order to implement the up-current write, the driver 260, which in some embodiments includes NMOS-follower circuitry such as that discussed above, is used to drive a high voltage on the source line 162. In order to establish the desired voltage across the magnetic tunnel junction to achieve the up-current needed to switch the state of the memory cell, a low voltage is applied to the bit line 161 by driver 250. In some embodiments, driver 250 includes PMOS-follower circuitry such as that discussed above, whereas in other embodiments, driver 250 may be a pass-gate or single transistor coupled to ground or another low voltage. Notably, in yet other embodiments, other types of drivers can be used with the precharge circuits and concepts described herein.

Prior to the application of the up-current write voltage, a high pulse is applied to the gate 221 of precharge transistor 220 in order turn on the transistor 220 and pull the source line to a high voltage in preparation for the driver 260 driving the voltage on the source line for the up-current write. While transistor 220 is shown to be coupled to a high voltage source to accomplish this pull-up function, in other embodiments, the transistor 220 can pull the source line to other specific voltages in preparation for the up-current write. Such precharging of the source line can reduce the amount of time needed to accomplish the up-current write during write-back operations such as those associated with precharge operations. Notably, a similar pulse can be applied to the gate 211 of transistor 210 in order to pull the bit line 161 low prior to the up-current write. Thus, transistor 210, which was also included in FIG. 5, can be used to speed up both up-current write operations as well as the evaluation phase of the self-referenced read operation.

Figure 8:
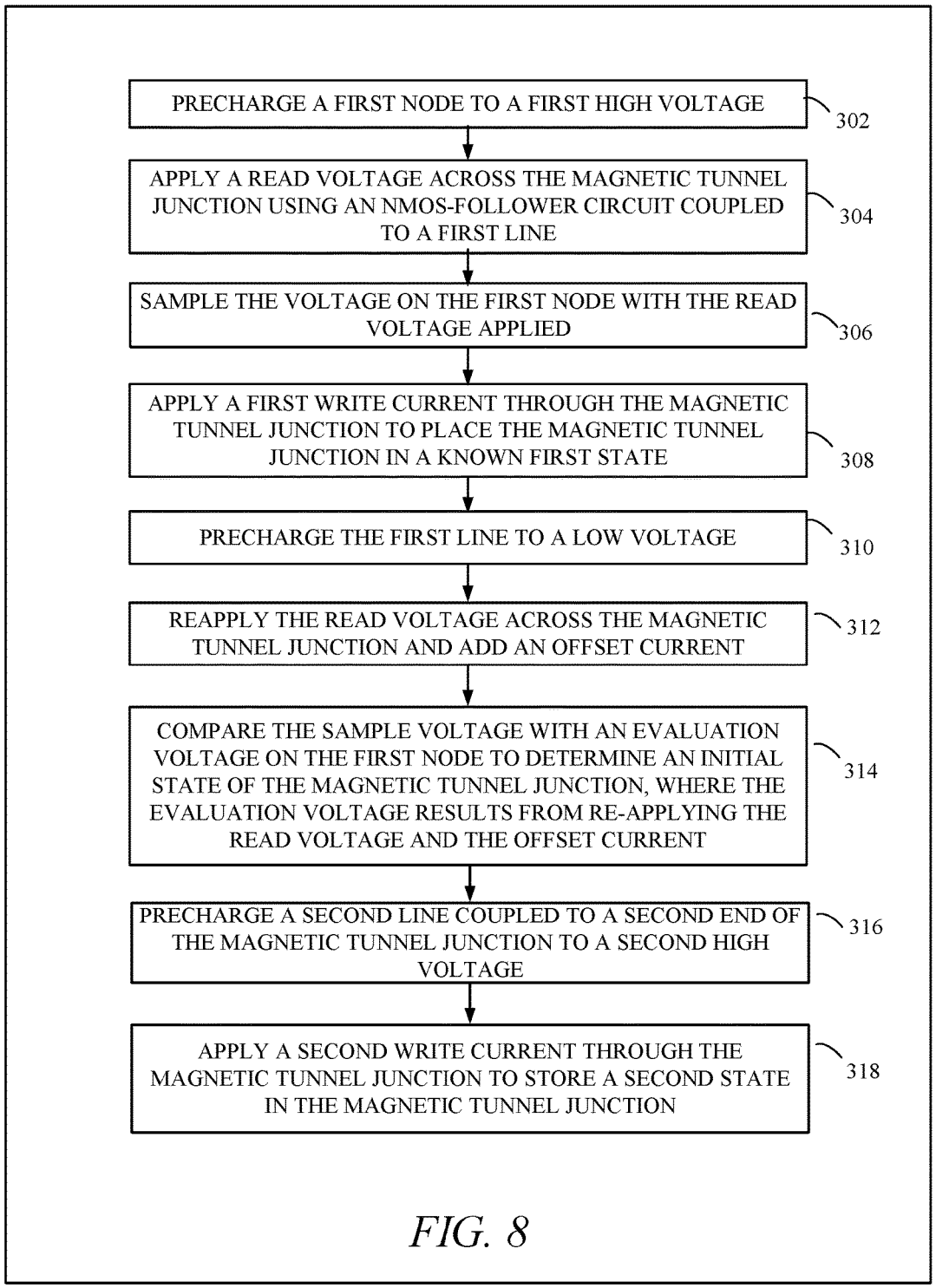
FIGS. 8 and 9 are flow charts corresponding to methods for operating sense amplifier circuitry that includes precharge circuitry in accordance with exemplary embodiments.
Figure 9:
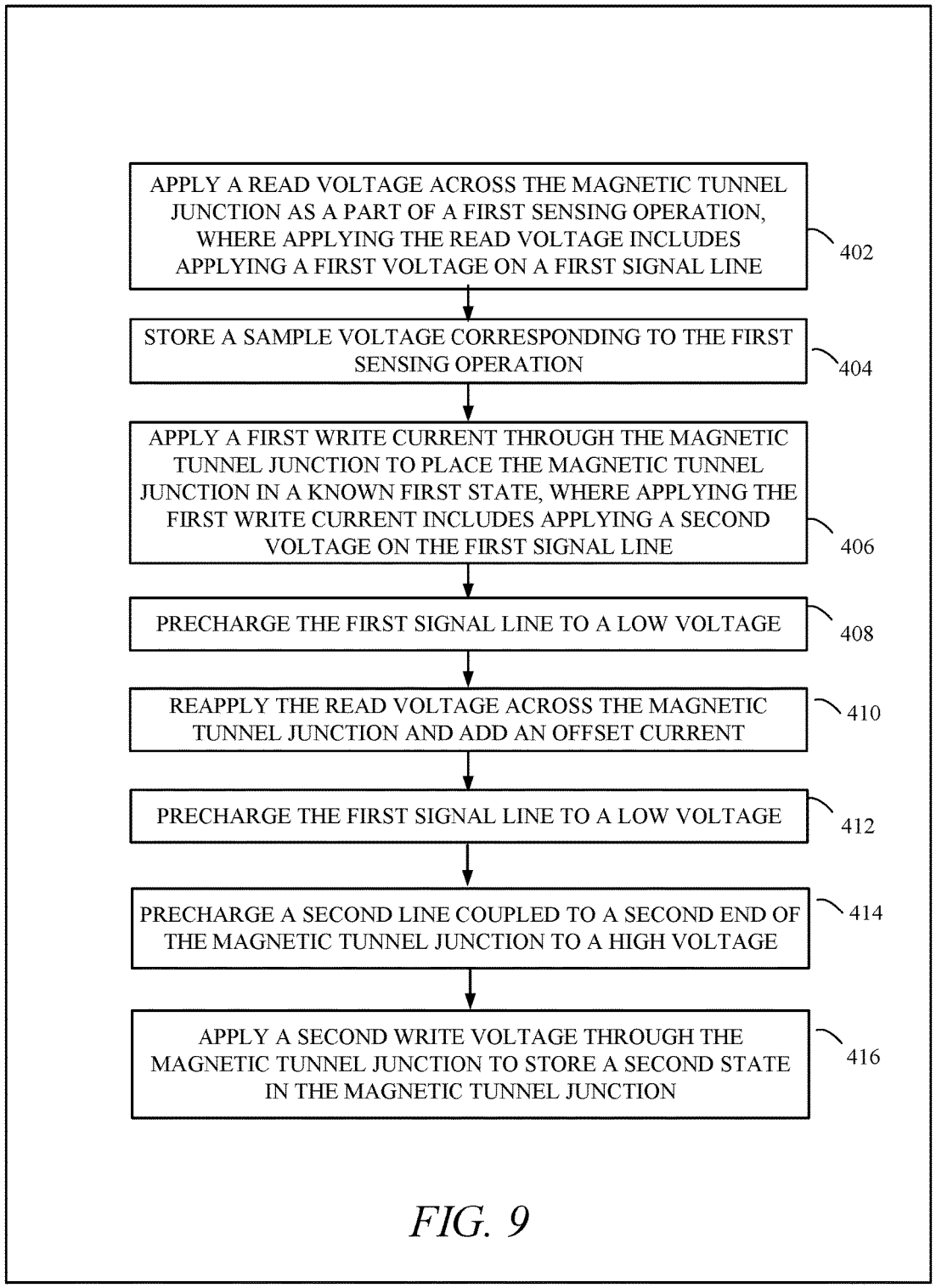

FIGS. 8 and 9 are flow charts that illustrate exemplary embodiments for using precharging in sense amplifier and write-back circuits such as those described above. The operations included in the flow charts may represent only a portion of the overall processes used to operating the device. For illustrative purposes, the following description of the methods in FIGS. 8 and 9 may refer to elements mentioned above in connection with FIGS. 2-7. It should be appreciated that methods may include any number of additional or alternative tasks, the tasks shown in FIGS. 8 and 9 need not be performed in the illustrated order, and the methods may be incorporated into a more comprehensive procedure or process having additional functionality not described in detail herein. Moreover, one or more of the tasks shown in FIGS. 8 and 9 could be omitted from an embodiment as long as the intended overall functionality remains intact.

FIG. 8 illustrates a flow chart of a method for operating memory cell that includes a magnetic tunnel junction. In some embodiments, the steps performed in FIG. 8 correspond to those steps used during a self-referenced read operation that includes certain precharging operations intended to speed up the self-referenced read. At 302 a first node is precharged to a first high voltage. For example, this can correspond to precharging the evaluation node 139 depicted in FIG. 5. In one embodiment, precharging the evaluation node 139 to a high voltage includes precharging the gate node of a PMOS transistor (e.g. transistor 123) to a low voltage such that the PMOS transistor pulls up the evaluation node 139.

At 304 a read voltage is applied across the magnetic tunnel junction using an NMOS-follower circuit that is coupled to a first line, where the first line is coupled to a first end of the memory cell. As discussed above, the first line may correspond to a bit line that couples the NMOS-follower circuit to the memory cell. As also noted above, the read voltage that is applied across the magnetic tunnel junction is preferably small enough that it does not disturb the magnetic state of the memory cell as it is only intended to be used to sense the resistance through the magnetic tunnel junction. The NMOS-follower circuit, which is coupled between the first node that has been precharged to the high voltage and the bit line, allows for charge sharing between the first node and the bit line when the NMOS-follower circuit is enabled. As described above with respect to FIGS. 3-5, the NMOS-follower circuit used to apply the read voltage can include a switch transistor as well as an NMOS-follower transistor. Applying the read voltage across the magnetic tunnel junction can also include driving a second line (e.g. the source line) to a low voltage, which may be accomplished using PMOS-follower circuitry or with a pass-gate or transistor coupled to ground or another low voltage.

At 306, while the read voltage is being applied, the voltage generated on the first node is sampled. Such sampling results in a sample voltage that can be stored, for example, on the capacitor 125 shown in FIG. 5. Following the sample operation at 306, a first write current is applied through the magnetic tunnel junction at 308 to place the magnetic tunnel junction in a known first state. As discussed above, this can include performing a down-current write operation that forces the magnetic tunnel junction into the low state.

Following the write operation at 308, at 310 the first line, which may be the bit line, is precharged to a low-voltage. As described above, because the write operation performed as a part of the self-referenced read operation leaves the bit line at a very high voltage level, this can impede the ability of the read NMOS-follower circuit to quickly regulate the read voltage across the magnetic tunnel junction during the second sensing operation. As such, precharging the bit line to a low voltage prior to the second sensing operation can help ensure that adequate gate-to-source voltage exists on the NMOS-follower transistor used for applying the read voltage so that faster application of the read voltage is possible. As discussed above, precharging the bit line to a low voltage can include applying a pulse to the gate of a transistor coupled to between the bit line and a low voltage supply such as ground.

At 312 the read voltage is reapplied across the magnetic tunnel junction and an offset current is added in order to allow for better differentiation between the first and second sensing operations. At 314 the sample voltage stored earlier is compared with an evaluation voltage on the first node, where the evaluation voltage results from reapplying the read voltage together with the offset current. Based on the comparison, a determination as to the initial state of the magnetic tunnel junction can be made, where, as described above, the state of the magnetic tunnel junction may or may not have changed as a result of the write operation at 308.

Assuming that the determination performed at 314 results in a determination that the initial state of the magnetic tunnel junction was the second state, which is different than the first state forced upon magnetic tunnel junction at 308, a write-back operation may be used to restore the initial state stored in the magnetic tunnel junction. In other cases, while the initial state may correspond to the first state, a write operation received by the memory may change the data to be stored in the particular memory cell being accessed such that a write-back operation, which may be a part of a precharge operation, needs to store the second state in the memory cell. As also described above, storing the second state in the memory cell can include performing an up-current write operation, where for an up-current write operation, a high voltage level is applied on the source line while a low voltage level is applied on the bit line. As such, performing further precharging can benefit the performance of such an up-current write operation in terms of how quickly it can be implemented.

At 316 a second line coupled to a second end of the magnetic tunnel junction is precharged to a second high voltage. In some embodiments this corresponds to precharging the source line coupled to the second end of the memory cell. As discussed above in conjunction with FIG. 7, the bit line can also be precharged low prior to such a write-back operation involving an up-current write. At 318 second write current is applied through the magnetic tunnel junction to store the second state in the magnetic tunnel junction, thus completing the write-back operation.

It should be noted that the various "high voltage" and "low voltage" levels discussed herein do not require the same "high" or "low" voltages in all instances and are not meant to be limited to any particular voltage supply (e.g. VDD or GND). Instead, it should be understood that different "high" or "low" voltage levels can be used in different circumstances in order to achieve the goals of sensing the information stored using the magnetic tunnel junctions and storing new data in such magnetic tunnel junctions.

FIG. 9 illustrates a flow chart of another method for operating a magnetic memory that includes a memory cell having a magnetic tunnel junction. The embodiment described with respect to FIG. 9 includes precharging a first signal line to a low voltage, where the first signal line may correspond to a bit line as discussed above. Precharging of the bit line to the low voltage can occur after performing a down current write and prior to the reapplication of the read voltage during the second sensing operation in a self-referenced read. Precharging the bit line to the low-voltage can also occur prior to a write-back operation as discussed above, where such precharging may be done in conjunction with precharging the source line coupled to the memory cell to a high voltage. Thus, in some embodiments, the different precharging operations discussed above are all be used together in order to speed up both self-referenced read and write-back operations. In other embodiments, a subset of the precharge circuitry and techniques are used in order to speed up only certain aspects of those operations.

At 402 a read voltage is applied across the magnetic tunnel junction as a part of a first sensing operation. Applying the read voltage across the magnetic tunnel junction includes applying a first voltage on the first signal line, which, in the context of the embodiments discussed above, corresponds to the bit line. Different types of drivers, including NMOS-follower circuitry, can be used to apply the read voltage. At 404 a sample voltage corresponding to the first sensing operation is stored.

After storing the sample voltage at 404, at 406 a first write current is applied through the magnetic tunnel junction to place the magnetic tunnel junction in a known first state. Applying the first write current can include applying a second voltage on the bit line, where, as discussed above, the second voltage is typically much higher than the first voltage used during sensing operations. Because the bit line is left at a high voltage level at the conclusion of the write operation at 406, it can be precharged at 408 to a low-voltage prior to the second sensing operation at 410. Precharging the bit line to a low-voltage at 408 enables the reapplication of the read voltage at 410 to occur with less delay. Notably, an offset current can also be added during the reapplication of the read voltage at 410 in order to provide differentiation between the initial sample voltage and the evaluation voltage determined as a result of the second sensing operation.

The self-referenced read operation, which determines the initial state of the magnetic tunnel junction, can result in the data corresponding to that magnetic tunnel junction being stored in temporary data storage. Thus, the operation performed in FIG. 9 can be a part of an activate operation during which a page of memory is opened and placed in temporary data storage for access by read and write commands. Following the completion of the read/write commands, the page can be closed such that the data stored in the temporary data storage is written back into the memory cells of the array. As also noted above, all of the memory cells in the page of memory accessed are left in the first state at the conclusion of the self-referenced read operation. Therefore, only those memory cells that are intended to store the second state at the conclusion of the write-back operation need to be written during the write-back.

At 412, the first signal line (e.g. bit line) is again precharged to a low-voltage. Similarly, at 414 a second signal line (e.g. source line) is precharged to a high voltage. Such precharging helps enable the application of the second write current at 416, where the second write current results in an up-current write occurring and the second state being stored in the magnetic tunnel junction.

The precharging circuitry and schemes disclosed herein can be used to speed up portions of the reading and writing processes corresponding to magnetic memory cells. By including such precharging circuitry in the sense amplifier circuitry used to access the memory cells, the different stages of a self-referenced read operation can be stepped through more quickly as the precharging enables the drivers to achieve the desired voltages across the magnetic tunnel junction quickly. Similarly, precharging circuits can also help in write-back operations such as those that include up-current write operations.

While exemplary embodiments have been presented above, it should be appreciated that many variations exist. Furthermore, while the description uses spin-torque MRAM devices that include memory cells in a specific example arrangements, the teachings may be applied to other memory devices having different architectures in which the same concepts can be applied.

The particular embodiments disclosed above are illustrative only and should not be taken as limitations, as the embodiments may be modified and practiced in different but equivalent manners apparent to those skilled in the art having the benefit of the teachings herein. Accordingly, the foregoing description is not intended to limit the disclosure to the particular form set forth, but on the contrary, is intended to cover such alternatives, modifications and equivalents as may be included within the spirit and scope of the inventions as defined by the appended claims so that those skilled in the art should understand that they can make various changes, substitutions and alterations without departing from the spirit and scope of the inventions in their broadest form.

What is claimed is:

1. A method of operation of a memory cell that includes a magnetic tunnel junction having a first end and a second end, comprising:
    applying a read voltage across the magnetic tunnel junction using a first circuit coupled between a first node and a first line, wherein the first line is coupled to the first end of the magnetic tunnel junction;
    while applying the read voltage, sampling a sample voltage on the first node, wherein the sample voltage results from current flow through the magnetic tunnel junction based on the read voltage on the first line;
    after sampling the sample voltage, applying a first write current through the magnetic tunnel junction to place the magnetic tunnel junction in a known first state;
    after applying the first write current:
        precharging the first line to a low voltage;
        after precharging the first line to the low voltage, re-applying the read voltage across the magnetic tunnel junction; and
        comparing the sample voltage with an evaluation voltage on the first node to determine an initial state of the magnetic tunnel junction, wherein the evaluation voltage results from re-applying the read voltage; and
    after determining the initial state of the magnetic tunnel junction, storing a second state in the magnetic tunnel junction, wherein storing the second state in the magnetic tunnel junction includes:
        precharging a second line to a second high voltage, wherein the second line is coupled to the second end of the magnetic tunnel junction; and
        applying a second write current through the magnetic tunnel junction, wherein the first write current flows through the magnetic tunnel junction before flowing through a corresponding selection transistor of the memory cell, and wherein the second write current flows through the corresponding selection transistor before the magnetic tunnel junction.

2. The method of claim 1, wherein re-applying the read voltage further comprises providing an additional offset current through the magnetic tunnel junction while re-applying the read voltage, wherein the evaluation voltage results from re-applying the read voltage and providing the additional offset current.

3. The method of claim 2, wherein an amount of additional offset current is determined based on sequential application of different offset currents to determine the amount of additional offset current.

4. The method of claim 1, wherein applying the read voltage across the magnetic tunnel junction using the first circuit coupled between the first node and the first line further comprises applying the read voltage across the magnetic tunnel junction using an NMOS-follower circuit coupled between a first node and a first line.

5. The method of claim 1, further comprising precharging the first node to a first high voltage before applying the read voltage across the magnetic tunnel junction and sampling the sample voltage.

6. The method of claim 5, wherein precharging the first node to the first high voltage further comprises applying a low voltage to a gate of a PMOS transistor, wherein a first terminal of the PMOS transistor is coupled to a high supply voltage, and wherein a second terminal of the PMOS transistor is coupled to the first node.

7. The method of claim 1, wherein precharging the first line to the low voltage further comprises providing a pulse to a gate of a transistor coupled between the first line and a low voltage source.

8. The method of claim 1, wherein precharging the first line to the low voltage further comprises precharging the first line to ground.

9. The method of claim 1, wherein precharging the first line to the low voltage further comprises applying a pulse to the gate of an NMOS pulldown transistor, wherein a first terminal of the NMOS pulldown transistor is coupled to the first line and a second terminal of the NMOS pulldown transistor is coupled to ground.

10. An apparatus comprising:
    a memory cell that includes a magnetic tunnel junction coupled in series with a selection transistor;
    preamplifier circuitry coupled to a first end of the memory cell by a first line, wherein the preamplifier circuitry includes a capacitor;
    a first NMOS-follower circuit coupled to the first line;
    a first PMOS-follower circuit coupled to a second end of the memory cell by a second line;
    a first precharge transistor coupled between the first line and a first low voltage source;
    a second precharge transistor coupled to the second line; and
    control circuitry coupled to the preamplifier circuitry, the first NMOS-follower circuit, the first PMOS-follower circuit, a gate of the first precharge transistor, and a gate of the second precharge transistor, the control circuitry configured to:
        apply a read voltage across the magnetic tunnel junction during a first sense phase using the preamplifier circuitry, wherein a sample voltage corresponding to current through the magnetic tunnel junction as a result of the read voltage is stored in the capacitor during the first sense phase;

after the first sense phase, apply a first write current through the magnetic tunnel junction using the first NMOS-follower circuit, wherein the first write current places the magnetic tunnel junction in a known first state;

after applying the first write current, apply a voltage pulse to the gate of the first precharge transistor such that the first precharge transistor pulls the first line to a low voltage after the magnetic tunnel junction is placed in the known first state; and apply a precharge control voltage to the second precharge transistor prior to a write-back operation in which a second write current is generated through the magnetic tunnel junction, wherein the second precharge transistor pulls the second line to a high voltage prior to initiation of the second write current.

11. The apparatus of claim 10, wherein the preamplifier circuitry further comprises:

a second NMOS-follower circuit coupled between a first node and the first line;

a PMOS transistor coupled between the first node and a high voltage source, wherein the capacitor is coupled between a gate of the PMOS transistor and the high voltage source;

a second precharge transistor coupled between the gate of the PMOS transistor and a second low voltage source; and drive a gate of the second precharge transistor such that the gate of the PMOS transistor is pulled low in a precharge phase, wherein the PMOS transistor pulls the first node high during the precharge phase, wherein the precharge phase precedes the first sense phase.

12. The apparatus of claim 10, further comprising an offset current source coupled to the control circuitry, wherein the offset current source generates an offset current, and wherein the control circuitry is further configured to:

after the first precharge transistor pulls the first line to the low voltage, re-apply the read voltage using the preamplifier circuitry during a second sense phase; and while re-applying the read voltage during the second sense phase, apply the offset current through the magnetic tunnel junction using the offset current source, wherein an evaluation voltage corresponding to a combination of the offset current and current through the magnetic tunnel junction as a result of the re-applied read voltage is generated.

13. The apparatus of claim 12, further comprising a first PMOS-follower circuit coupled to a second end of the memory cell.

14. The apparatus of claim 13, further comprising a second PMOS-follower circuit coupled to the second end of the memory cell, wherein the control circuitry is coupled to the first and second PMOS-follower circuits and provides control signals to the first and second PMOS-follower circuits such that the first PMOS-follower circuit pulls the second end of the memory cell to a first low voltage during each of the first and second sense phases and such that the second PMOS-follower circuit pulls the second end of the memory cell to a second low voltage while the first write current is applied through the magnetic tunnel junction.

15. The apparatus of claim 13, further comprising:

a second line coupling the first PMOS-follower circuit to the second end of the memory cell; and a third precharge transistor coupled to the second line and the control circuitry, wherein the control circuitry is further configured to apply a precharge control voltage to the third precharge transistor prior to a write-back operation in which a second write current is generated through the magnetic tunnel junction, wherein the third precharge transistor pulls the second line to a high voltage prior to initiation of the second write current.

16. An apparatus comprising:

a memory cell that includes a magnetic tunnel junction coupled in series with a selection transistor;

a first NMOS-follower circuit coupled between a first node and a first end of the memory cell;

a second NMOS-follower circuit coupled to the first end of the memory cell;

a first precharge transistor coupled between the first end of the memory cell and a first low voltage source;

a second precharge transistor coupled to a second end of the memory cell; and control circuitry coupled to the first NMOS-follower circuit, the second NMOS follower circuit, a gate of the first precharge transistor, and a gate of the second precharge transistor, the control circuitry configured to:

apply a read voltage across the magnetic tunnel junction during a first sense phase using the first NMOS-follower circuit, wherein a sample voltage corresponding to current through the magnetic tunnel junction as a result of the read voltage is stored during the first sense phase;

after the first sense phase, apply a first write current through the magnetic tunnel junction using the second NMOS-follower circuit, wherein the first write current places the magnetic tunnel junction in a known first state;

after the magnetic tunnel junction is placed in the known first state, pull the first end of the memory cell to a low voltage using the first precharge transistor;

after pulling the first end of the memory cell to the low voltage, re-apply the read voltage across the magnetic tunnel junction during a second sense phase using the first NMOS-follower circuit; and apply a precharge control voltage to the second precharge transistor prior to a write-back operation in which a second write current is generated through the magnetic tunnel junction, wherein the second precharge transistor pulls the second line to a high voltage prior to initiation of the second write current.

17. The apparatus of claim 16, further comprising a first PMOS-follower circuit coupled to the second end of the memory cell and the control circuitry, wherein the control circuitry is further configured to apply a first PMOS control voltage to the first PMOS-follower circuit during the first and second sense phases such that the first PMOS-follower circuit pulls the second line to a first low voltage during the first and second sense phases.

18. The apparatus of claim 17, further comprising a second PMOS-follower circuit coupled to the second end of the memory cell and the control circuitry, wherein the control circuitry is further configured to apply a second PMOS control voltage to the second PMOS-follower circuit while the first write current is applied such that the second PMOS-follower circuit pulls the second line to a second low voltage when the first write current is applied.

* * * * *